United States Patent
Tassin et al.

(10) Patent No.: US 7,277,034 B2
(45) Date of Patent: Oct. 2, 2007

(54) GAIN CONTROL FOR CARTESIAN LOOP TRANSMITTER WITH DIGITAL PROCESSING

(75) Inventors: Claire Tassin, Grenoble (FR); Patrice Garcia, Crolles (FR)

(73) Assignee: STMicroelectronics SA, Paris (FR)

( * ) Notice: Subject to any disclaimer, the term of this patent is extended or adjusted under 35 U.S.C. 154(b) by 0 days.

(21) Appl. No.: 11/402,286

(22) Filed: Apr. 11, 2006

(65) Prior Publication Data
US 2006/0238393 A1    Oct. 26, 2006

(30) Foreign Application Priority Data
Apr. 22, 2005    (FR)    ................. 05 04078

(51) Int. Cl.
*H03M 1/62*    (2006.01)
(52) U.S. Cl. ............ 341/139; 341/144; 341/155
(58) Field of Classification Search .......... 341/120, 341/118, 139, 144, 155; 375/295–297
See application file for complete search history.

(56) References Cited

U.S. PATENT DOCUMENTS 6,466,628 B1 * 10/2002 Kim .............. 375/297
6,591,090 B1 * 7/2003 Vuorio et al. .......... 455/126
6,928,272 B2 * 8/2005 Doi .................. 455/114.2
6,934,341 B2 * 8/2005 Sahlman .............. 375/297
7,145,962 B2 * 12/2006 Lee .................. 375/296
2002/0050372 A1   5/2002 Lee
2004/0166813 A1   8/2004 Mann et al.
2004/0184569 A1   9/2004 Challa et al.

FOREIGN PATENT DOCUMENTS

EP    0 967 717 A2    12/1999
EP    0 951 143 A2    6/2004
EP    0 951 143 A3    6/2004

OTHER PUBLICATIONS

French Search Report; FR 0504078; Dec. 7, 2005.

* cited by examiner

*Primary Examiner*—Brian Young
(74) *Attorney, Agent, or Firm*—Hogan & Hartson LLP

(57)    ABSTRACT

A device includes a digital circuit for receiving input signals and Cartesian feedback signals includes a stage for combining the input signals and the feedback signals to generate error signals. The digital circuit is linked via a conversion stage to an analogue circuit suitable for receiving the error signals, and which includes a stage for generating an output signal from the error signals and a stage for generating the feedback signals from the output signal. The digital circuit also includes at least one gain control stage before the combination stage for modifying the gain applied to the input signals.

12 Claims, 2 Drawing Sheets

GAIN CONTROL FOR CARTESIAN LOOP TRANSMITTER WITH DIGITAL PROCESSING

RELATED APPLICATION

The present application claims priority of French Patent Application No. 05 04078 filed Apr. 22, 2005, which is incorporated herein in its entirety by this reference.

FIELD OF THE INVENTION

The present invention relates to gain control devices and methods.

BACKGROUND OF THE INVENTION

Cartesian loop gain control devices are used in particular in mobile equipment of radiocommunication systems in which the gain control needs to be precise and have a wide dynamic range.

For example, a "Zero-IF" type radio transmitter in which baseband signals are directly transposed to the transmission frequency without passing through any intermediate frequencies, the gain control is divided over a number of voltage boosting analogue stages, or variable gain amplification (VGA) stages, to total 75 dB of functional dynamic range in 1 dB steps within the framework of the WCDMA (Wideband Code Division Multiple Access) standard. Such an architecture involves high current consumption and requires a large area of silicon.

Moreover, the increase in bit rates in telecommunications is accompanied by non-constant envelope modulations which require linear processing. Consequently, use is made of linearization devices such as, in particular, Cartesian loop devices which are normally implemented in the form of analogue circuits. This requires a footprint and a level of consumption that are incompatible with the current integration trends in mobile equipment.

Recently, Cartesian loop linearization devices which use digital components have been described, e.g., in U.S. Patent Publication No. 2004/0166813 A1.

Such known devices include a digital processing circuit which is suitable for receiving baseband input signals and Cartesian feedback signals, and which includes a stage for combining the baseband input signals and feedback signals to generate error signals. This digital processing circuit is linked via an analogue/digital and digital/analogue conversion stage to an analogue processing circuit. This analogue processing circuit is suitable for receiving the error signals and includes an output stage for generating an output signal from the error signals, and a feedback stage for generating the feedback signals from the output signal.

Such a device can be used with a conventional gain control including a number of analogue amplification stages, which raises the problems of consumption and footprint mentioned above. In particular, these consumption and footprint problems run counter to the trends towards increased integration in terms of footprint for reducing fabrication costs with a view to use in a mobile device such as a mobile telephone, for example.

SUMMARY OF THE INVENTION

The present invention seeks to resolve this problem by defining a Cartesian loop gain control device and method for reducing the consumption and footprint. To this end, the subject of the present invention is a gain control device which includes a digital processing circuit suitable for receiving baseband input signals and Cartesian feedback signals and including a stage for combining the baseband input signals and the Cartesian feedback signals to generate error signals and at least one gain control stage disposed before the stage for combining stage and operative for modifying the gain applied to the baseband input signal, an analogue/digital and digital/analogue conversion stage and an analogue processing circuit suitable for receiving the error signals and including a processing stage for generating an output signal from the error signals and a feedback stage for generating the Cartesian feedback signals from the output signal, wherein the digital processing circuit is linked to the analogue processing circuit by the analogue/digital and digital analogue conversion stage.

Another subject of the present invention is mobile equipment of a radiocommunication system including a device as described above.

The invention also relates to a gain control method involving digitally processing baseband input signals. A digital gain control substep is operative for modifying the gain applied to the baseband input signals and another substep combines the baseband signals and the Cartesian feedback signals to generate error signals. A step of processing analogue signals, including a substeps of generating an output signal from the error signals, and generating the Cartesian feedback signals from the output signal.

Thus, through the use of a digital gain control stage, the gain dynamic range and the precision required to implement the Cartesian loop can be obtained with low consumption and a reduced area of silicon.

BRIEF DESCRIPTION OF THE DRAWINGS

Other advantages of the invention will become apparent from the dependent claims and on reading the description and the drawings in which:

DETAILED DESCRIPTION

Figure 1:
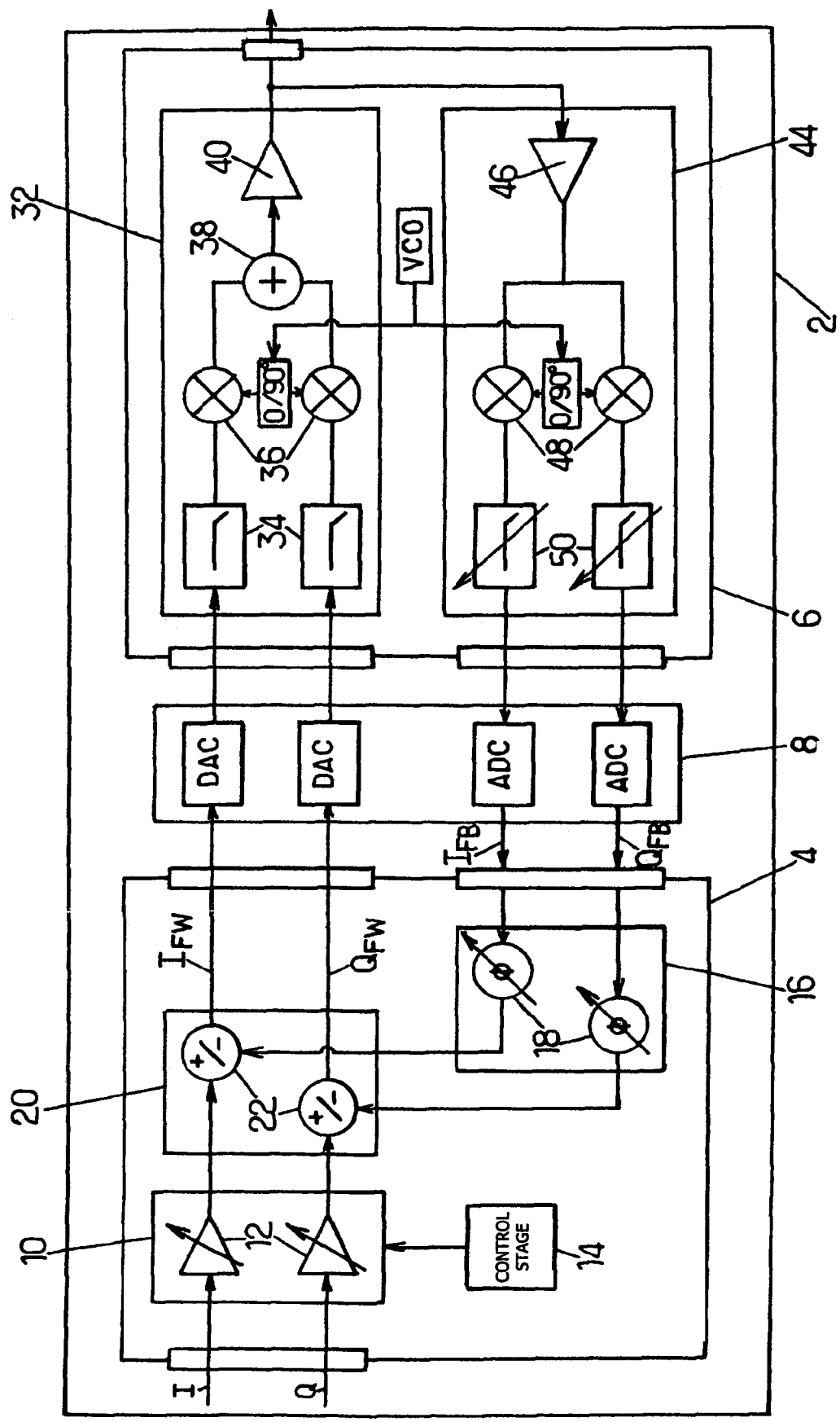
FIG. 1 is a block diagram of a Cartesian loop gain control device according to the invention.

With reference to FIG. 1, an embodiment of a gain control device for a Zero-IF Cartesian loop WCDMA transmitter according to the invention is designated by the general numeric reference 2. It includes a digital processing circuit 4 linked to an analogue processing circuit 6 via a converter stage 8 and includes a Cartesian feedback loop.

The digital processing circuit 4 is suitable for receiving baseband input signals, in the form, for example, of the real I and imaginary Q components of a complex input signal.

The digital processing circuit 4 also includes a gain control stage 10 for amplifying and attenuating the gain of the I and Q components of the baseband signals. This stage 10 includes, on each channel, a controllable digital controller 12, commonly designated VGA and designed to amplify and/or attenuate the gain of the corresponding input signal.

The controllers of the stage 10 are controlled by a control stage 14 suitable for controlling the gain level of the various controllers of the stage 10 according to the operating parameters of the device 2 and in particular, according to the baseband signals, Cartesian loop feedback signals and component characteristics of the other stages of the device and, in particular, of the conversion stage 8. This stage 14 includes describing the operation of the device 2 in the form of a control algorithm.

Since the gain control stage 10 is implemented using digital circuits, it is controlled directly by the control stage 14, which provides better integration and reduces the area of silicon required.

In the embodiment described, the gain control stage 10 is suitable for providing a variation of 66 dB of gain dynamic range.

The digital processing circuit 4 is also suitable for receiving the Cartesian feedback signals from the Cartesian feedback loop, that is, a component, denoted $I_{FB}$, corresponding to the feedback signal from the real part and a component, denoted $Q_{FB}$, corresponding to the feedback signal from the imaginary part. The subscript FB is short for "FeedBack".

The Cartesian feedback signals are first of all entered into a phase correction stage 16 conventionally comprising a phase shifter 18 on each channel.

The outputs of the amplification 10 and phase correction 16 stage are entered into a stage 20 for combining the baseband signals and Cartesian feedback signals, suitable for generating error signals.

Conventionally, this combination stage 20 compares the baseband signals and the feedback signals. To this end, it includes subtracters 22 suitable for determining the difference between each baseband component after amplification and each Cartesian feedback component after phase correction.

Thus, the combination stage 20 generates error signals corresponding to two components denoted $I_{FW}$ and $Q_{FW}$. The subscript FW is short for "Forward".

These error signals correspond to the baseband signals minus the feedback signals. Consequently, they include the non-linearities of the baseband signals from the forward subsystem of the loop. These error signals are used to create feedback signals as indicated below, such that the subtraction of the feedback signals provides the predistortion needed by the signals to linearize the output spectrum.

The digital processing circuit 4 is linked to the analogue processing circuit 6 via the conversion stage 8 comprising:

- a digital/analogue converters (DAC) converting the signals from the digital processing circuit 4 to the analogue processing circuit 6; and
- analogue/digital converters (ADC) converting the signals from the analogue processing circuit 6 to the digital processing circuit 4.

In the embodiment described, the digital/analogue converters DAC are 14-bit converters and the analogue/digital converters ADC are implemented in the conventional way.

The analogue processing circuit 6 is suitable for receiving the error signals as output by the conversion stage 8 in a processing stage 32 comprising, in the example described, anti-aliasing filters 34, followed by mixers 36, in quadrature, and an adder 38 adding the two channels to generate a so-called useful RF signal, to an amplifier 40. The amplifier 40 generates an output signal from the analogue processing circuit 6.

The output signal is also entered into a feedback stage 44. This stage 44 first of all includes an attenuator 46 linked to two mixers in quadrature 48, which demodulate the output signal into two baseband signals in quadrature $I_{FB}$ and $Q_{FB}$, each forming a Cartesian feedback component.

Advantageously, one and the same controller VCO (Voltage Controlled Oscillator) is used to generate the local oscillator signals of the mixers 36 of the processing stage 32 and the local oscillator signals of the mixers 48 of the feedback stage 44.

Each of these components is entered into a controllable filter 50 presenting a gain dynamic range of 9 dB. These filters 50 are linked at the output to the analogue/digital converters ADC of the conversion stage 8 to generate the Cartesian feedback components $I_{FB}$ and $Q_{FB}$. Advantageously, the gain control of the filters 50 is also provided by the control stage 14.

In the embodiment described, the functional dynamic range of each gain control stage 10 and 50 is determined according to the resolution of the digital/analogue converters DAC. In practice, the dimensioning of the DACs limits the gain dynamic range of the gain control stage 10 of the digital processing circuit 4 to avoid any loss of information in the DACs resulting from too great an attenuation of the signals which would prevent a precise encoding of the weakest powers.

In the example described, the DACs are implemented in a technology such as the 0.13 µm CMOS technology and operate at a frequency of around 38 MHz, or ten times the channel width according to the WCDMA standard, in order to relax the constraints on the dimensioning of the filters 34 placed at the output of the DACs.

It is, however, necessary to reserve a portion of the dynamic range of the DACs to encode the quantization noise floor in order to be able to encode a low power signal. The 14-bit DAC is segmented into 14 dedicated bits with a range of 66 dB and a quantization floor of 3 bits. A dynamic range of 1.2 V gives a binary encoding of the 1 dB attenuation steps and a least significant bit (LSB) of 13 µV with a precision of 0.2 dB.

The total functional dynamic gain control range of 75 dB is separated into a first portion of 66 dB provided by the controllers 12 of the control stage 10 of the digital circuit 4, and a second portion of 9 dB provided by the filters 50 of the feedback stage of the analogue circuit 6.

Consequently, for an attenuation of 0 to 66 dB, only the digital VGAs 12 of the control stage 10 are used, and for attenuations from 67 to 75 dB, both the digital VGAs 12 of the control stage 10 and the additional gain of 9 dB from the loop filters 50 are used, each gain control stage being suitable for providing the gain control over a respective portion of the functional dynamic range of 75 dB.

The performance of the mixers 36 also affects the gain control range provided by the stage 10. In practice, the mixers introduce a local oscillator leakage and too great an attenuation of the useful signals results in degradation of the signal-to-noise ratio. Consequently, the portion of the functional dynamic range in which the gain is controlled by the gain control stage 10 of the digital processing circuit 4 is determined according to said performance of the components forming the stages through which the useful signal passes and in particular the conversion 8 and processing 32 stage.

Figure 2:
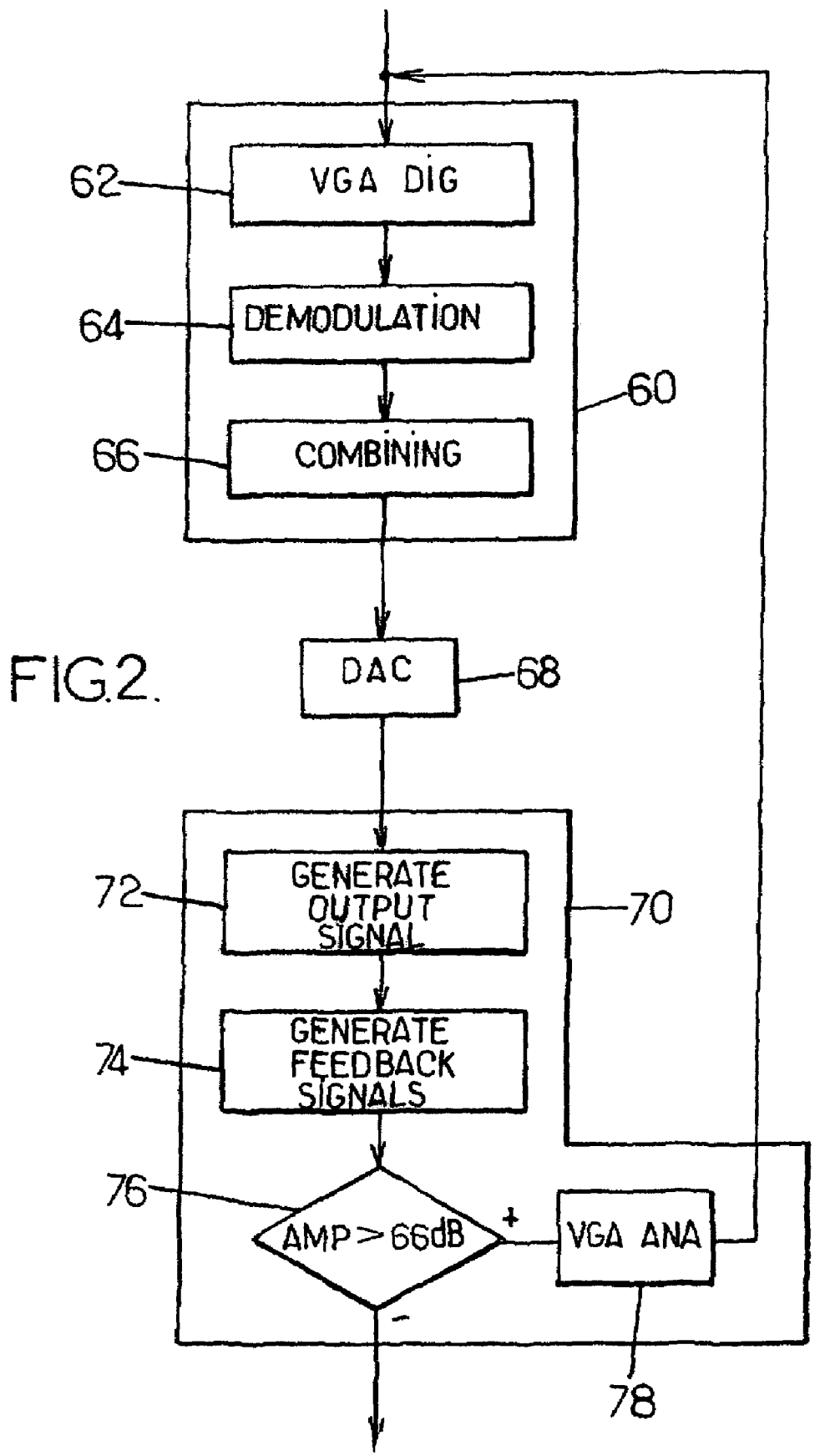
FIG. 2 is a flow diagram of the inventive Cartesian loop gain control method.

The device described with reference to FIG. 1 can be used to implement the method represented by the flow diagram of FIG. 2.

This method begins with provision of the baseband signals for their radio frequency transmission. The method then includes a digital processing step 60 which includes a digital gain control substep 62, implemented by the gain control stage 10, to modify the gain of the baseband input signals over the portion of dynamic range from 0 to 66 dB, as indicated above.

The step 60 also includes a substep 64 for demodulating the feedback signals which is followed by a substep 66 for combining the amplified baseband signals with the transposed Cartesian feedback signals to generate the error signals.

These error signals are converted into two analogue signals in a conversion step 68 implemented by the DACs of the conversion stage 8, followed by an analogue processing step 70 including a substep 72 for generating an output signal from the error signals by radiofrequency modulation then amplification. The method then includes a substep 74 for generating the Cartesian feedback signals from the output signal by sampling the radiofrequency output and demodulation.

Advantageously, the step 70 also includes a test 76 for determining whether the gain dynamic range exceeds 66 dB. If this test is positive, then the gain control applied in the substep 62 is insufficient and the method includes a substep 78 for controlling the analogue gain of the feedback signals implemented by the variable gain filters 50. In the embodiment described, this comprises activating a gain modification of 9 dB on the loop filters 50. The method then returns to the step 60 to continue with the substep 62 which is repeated. This loopback is used to maintain the precision required on the 1 dB steps after the gain control implemented by the filters 50.

This substep 78 and the loopback are applied only to provide the gain control over the portion of dynamic range between 66 and 75 dB.

Other embodiments of the invention can, of course, be envisaged. In particular, in a first variant, the DACs of the conversion stage 8 are dimensioned so that the control stage 10 of the digital circuit 4 implemented in the substep 62 provides the gain control over the entire functional dynamic range. Advantageously, in such an embodiment, the DACs are 17-bit and the filters 50 are not variable gain filters, such that the analogue circuit 6 corresponds to a conventional circuit and the substep 78 is not applied.

Furthermore, the gain control in the analogue processing circuit 6 can be applied by components other than the filters 50 and, where appropriate, by dedicated components.

Moreover, other stages can be introduced in the device such as, for example, a DC component compensation stage, placed at the input of the digital processing circuit 4.

Similarly, the amplifier 40 can include a preamplification stage PPA and an amplification stage PA, and the signals used to form the Cartesian feedback signals can be sampled at the output of any of these amplification stages.

Advantageously, the digital VGAs 12 of the control stage 10 are implemented, as described in U.S. Patent Publication No. 2004/0184569 A1, by calculating the attenuations in logarithmic base mode and not in linear base mode, so as to avoid the use of complex multipliers to use less cumbersome adders in the combination stage.

In the example described, the invention is designed for use in a mobile environment using the WCDMA standard, but the invention can also be applied in any type of environment and, in particular, with other functional dynamic ranges, in base stations or even with other standards, such as the CDMA2000 standard.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A gain control device comprising:
   a digital processing circuit for receiving baseband input signals and Cartesian feedback signals and including a stage for combining the baseband input signals and the Cartesian feedback signals to generate error signals and at least one gain control stage disposed before the stage for combining stage and operative for modifying the gain applied to the baseband input signal;
   an analogue/digital and digital/analogue conversion stage; and
   an analogue processing circuit for receiving the error signals and including a processing stage for generating an output signal from the error signals and a feedback stage for generating the Cartesian feedback signals from the output signal, wherein the digital processing circuit is linked to the analogue processing circuit by the analogue/digital and digital analogue conversion stage.

2. A gain control device according to claim 1, wherein the gain control stage of the digital processing circuit is operative for providing gain control over an entire functional dynamic range.

3. A gain control device according to claim 2, wherein the conversion stage comprises 17-bit digital/analogue converters linking the digital processing circuit to the analogue processing circuit, and the gain control stage of the digital processing circuit is operative for providing gain control within a range of the order of 75 dB.

4. A gain control device according to claim 1, wherein the analogue processing circuit includes a gain control stage applied to the Cartesian feedback signals each of the gain control stages respectively of the digital processing circuit and of the analogue processing circuit is operative for providing gain control over a respective portion of a functional dynamic range.

5. A gain control device according to claim 4, further comprising:
   stages comprising components of predetermined performance characteristics and through which the signals pass, the portion of the functional dynamic range in which the gain is controlled by the gain control stage of the digital processing circuit being determined according to the performance characteristics of these components.

6. A gain control device according to claim 4, wherein the conversion stage includes digital/analogue converters, linking the digital processing circuit to the analogue processing circuit, which are 14-bit converters, the gain control stage of the digital processing circuit is operative for providing gain control within a range of the order of 66 dB and the gain control stage of the analogue processing circuit is operative for providing gain control within a range of the order of 9 dB.

7. A gain control method comprising:
   digitally processing baseband input signals, comprising the steps of:
      a digital gain control substep operative for modifying the gain applied to the baseband input signals; and
      combining the baseband signals and Cartesian feedback signals to generate error signals; and
   processing analogue signals, comprising the steps of:
      generating an output signal from the error signals; and
      generating the Cartesian feedback signals from the output signal.

8. The method according to claim 7, wherein the digital gain control substep provides gain control over an entire functional dynamic range.

9. The method according to claim 7, wherein the analogue processing substep includes an analogue gain control substep, each of the digital gain control and analogue gain control substeps being suitable for providing gain control over a respective portion of a functional dynamic range.

10. A gain control device comprising:
    a digital processing circuit for combining baseband input signals and Cartesian feedback signals to generate error signals and for modifying the gain applied to the baseband input signal;
    an analogue/digital and digital/analogue conversion stage; and
    an analogue processing circuit for receiving the error signals and for generating an output signal and for generating the Cartesian feedback signals from the output signal, and wherein the digital processing circuit is linked to the analogue processing circuit by the analogue/digital and digital analogue conversion stage.

11. A gain control method comprising:
    digitally processing baseband input signals, including modifying the gain applied to the baseband input signals and combining the baseband signals and Cartesian feedback signals to generate error signals; and
    processing analogue signals, including generating an output signal from the error signals and generating the Cartesian feedback signals from the output signal.

12. The method according to claim 11, wherein the step of modifying the gain comprises modifying the gain over an entire functional dynamic range.

* * * * *